United States Patent
Qu et al.

(10) Patent No.: US 11,088,181 B2
(45) Date of Patent: Aug. 10, 2021

(54) METHOD OF FABRICATING ARRAY SUBSTRATE, ARRAY SUBSTRATE, AND DISPLAY APPARATUS THEREOF

(71) Applicants: BOE TECHNOLOGY GROUP CO., LTD., Beijing (CN); Beijing BOE Display Technology Co., Ltd., Beijing (CN)

(72) Inventors: Lianjie Qu, Beijing (CN); Bingqiang Gui, Beijing (CN); Yonglian Qi, Beijing (CN); Guangdong Shi, Beijing (CN); Shuai Liu, Beijing (CN); Hebin Zhao, Beijing (CN)

(73) Assignees: BOE TECHNOLOGY GROUP CO., LTD., Beijing (CN); Beijing BOE Display Technology Co., Ltd., Beijing (CN)

( * ) Notice: Subject to any disclaimer, the term of this patent is extended or adjusted under 35 U.S.C. 154(b) by 581 days.

(21) Appl. No.: 16/073,038

(22) PCT Filed: Jan. 10, 2018

(86) PCT No.: PCT/CN2018/072080
§ 371 (c)(1),
(2) Date: Jul. 26, 2018

(87) PCT Pub. No.: WO2019/029125
PCT Pub. Date: Feb. 14, 2019

(65) Prior Publication Data
US 2021/0175261 A1 Jun. 10, 2021

(30) Foreign Application Priority Data
Aug. 11, 2017 (CN) .......................... 201710687463.3

(51) Int. Cl.
*H01L 27/12* (2006.01)
*G02F 1/1343* (2006.01)

(52) U.S. Cl.
CPC ........ *H01L 27/1259* (2013.01); *H01L 27/124* (2013.01); *H01L 27/1248* (2013.01); *G02F 1/13439* (2013.01); *G02F 1/134363* (2013.01)

(58) Field of Classification Search
None
See application file for complete search history.

(56) References Cited

U.S. PATENT DOCUMENTS 6,057,896 A     5/2000  Rho et al.
6,307,611 B1 * 10/2001  Kim ................. G02F 1/136227
                                                    349/138

(Continued)

FOREIGN PATENT DOCUMENTS

CN     1183570 A    6/1998
CN     1575525 A    2/2005

(Continued)

OTHER PUBLICATIONS

Second Office Action in the Chinese Patent Application No. 201710687463.3, dated Oct. 22, 2020; English translation attached.

(Continued)

*Primary Examiner* — Bo B Jang
(74) *Attorney, Agent, or Firm* — Intellectual Valley Law, P.C.

(57) ABSTRACT

The present application discloses a method of fabricating an array substrate. The method includes forming a first conductive material layer on a base substrate; forming an insulating layer on a side of the first conductive material layer distal to the base substrate, the insulating layer formed to cover a first part of the first conductive material layer, exposing a second part of the first conductive material layer;

(Continued)

over-etching the first conductive material layer to remove the second part of the first conductive material layer, and remove a portion of a periphery of the first part of the first conductive material layer to form a recess between the insulating layer and the base substrate, thereby forming a first electrode; and subsequent to forming the first electrode and the recess, annealing the insulating layer to mobilize a portion of the insulating layer above the recess and fill the recess with a mobilized insulating material.

12 Claims, 3 Drawing Sheets

(56) References Cited

U.S. PATENT DOCUMENTS

| | | |
|---|---|---|
| 6,403,409 B1 | 6/2002 | You |
| 2003/0076452 A1 | 4/2003 | Kim et al. |
| 2008/0061446 A1 | 3/2008 | You |
| 2017/0261805 A1 | 9/2017 | Zhao |

FOREIGN PATENT DOCUMENTS

| | | |
|---|---|---|
| CN | 1963646 A | 5/2007 |
| CN | 105116589 A | 12/2015 |
| CN | 106684097 A | 5/2017 |
| CN | 106783732 A | 5/2017 |
| JP | 2004239988 A | 8/2004 |

OTHER PUBLICATIONS

First Office Action in the Chinese Patent Application No. 201710687463.3, dated Mar. 23, 2020; English translation attached.
International Search Report & Written Opinion dated May 10, 2018, regarding PCT/CN2018/072080.

* cited by examiner

METHOD OF FABRICATING ARRAY SUBSTRATE, ARRAY SUBSTRATE, AND DISPLAY APPARATUS THEREOF

CROSS-REFERENCE TO RELATED APPLICATION

This application is a national stage application under 35 U.S.C. § 371 of International Application No. PCT/CN2018/072080, filed Jan. 10, 2018, which claims priority to Chinese Patent Application No. 201710687463.3, filed Aug. 11, 2017, the contents of which are incorporated by reference in the entirety.

TECHNICAL FIELD

The present invention relates to display technology, more particularly, to a method of fabricating an array substrate, an array substrate, and a display apparatus.

BACKGROUND

A liquid crystal display device includes an array substrate having a thin film transistor, a color filter substrate opposite to the array substrate, and a liquid crystal layer between the army substrate and the color filter substrate. An array substrate in some liquid crystal display apparatuses includes a common electrode and a pixel electrode. The pixel electrode is electrically connected to a drain electrode of a thin film transistor. The common electrode is provided with a common voltage through a common electrode signal line.

SUMMARY

In one aspect, the present invention provides a method of fabricating an array substrate, comprising forming a first conductive material layer on a base substrate; forming an insulating layer on a side of the first conductive material layer distal to the base substrate, the insulating layer formed to cover a first part of the first conductive material layer, exposing a second part of the first conductive material layer; over-etching the first conductive material layer to remove the second part of the first conductive material layer, and remove a portion of a periphery of the first part of the first conductive material layer to form a recess between the insulating layer and the base substrate, thereby forming a first electrode; and subsequent to forming the first electrode and the recess, annealing the insulating layer to mobilize a portion of the insulating layer above the recess and fill the recess with a mobilized insulating material.

Optionally, forming an insulating layer comprises forming a resin layer on a side of the first conductive material layer distal to the base substrate; exposing the resin layer using a mask plate; developing the resin layer subsequent to exposing; and removing a portion of the resin layer thereby forming the insulating layer.

Optionally, subsequent to annealing the insulating layer, further comprising forming a second electrode on a side of the insulating layer distal to the base substrate; wherein the second electrode is insulated from the first electrode by the insulating layer and the mobilized insulating material filled in the recess.

Optionally, the first electrode is a common electrode.

Optionally, the second electrode is a pixel electrode.

Optionally, the insulating layer is formed to have a thickness in a range of approximately 0.5 µm to approximately 2.0 µm.

Optionally, the insulating layer is formed to have a thickness in a range of approximately 1.0 µm to approximately 1.5 µm.

Optionally, annealing the insulating layer is performed at an annealing temperature in a range of approximately 220 degrees Celsius to approximately 250 degrees Celsius.

Optionally, annealing the insulating layer is performed for an annealing duration in a range of approximately 20 minutes to approximately 30 minutes.

Optionally, subsequent to forming the insulating layer and prior to over-etching the first conductive material layer and annealing the insulating layer, further comprising pre-annealing the insulating layer.

Optionally, pre-annealing the insulating layer is performed at a pre-annealing temperature in a range of approximately 120 degrees Celsius to approximately 150 degrees Celsius.

Optionally, pre-annealing the insulating layer is performed for an annealing duration in a range of approximately 2 minutes to approximately 5 minutes.

In another aspect, the present invention provides an array substrate, comprising a base substrate; a first electrode on the base substrate; an insulating layer on a side of the first electrode distal to the base substrate; and a second electrode on a side of the insulating layer distal to the first electrode; wherein the insulating layer comprises at least a first part and a second part; a projection of the first part of the insulating layer on the base substrate substantially overlaps with a projection of the first electrode on the base substrate; a projection of the second part of the insulating layer on the base substrate is substantially non-overlapping with the projection of the first electrode on the base substrate; and the second part of the insulating layer and the first electrode layer are in direct contact with a same layer.

Optionally, the insulating layer comprises a resin material.

Optionally, the second part of the insulating layer directly abuts a periphery of the first electrode; and the second part of the insulating layer insulates at least a portion of the periphery of the first electrode from the second electrode.

Optionally, the array substrate further comprises a second electrode on a side of the insulating layer distal to the first electrode.

Optionally, the second electrode comprising at least a first part, a second part, and a third part; a projection of the first part of the second electrode at least partially overlaps with the projection of the first part of the insulating layer on the base substrate; a projection of the second part of the second electrode is substantially non-overlapping with projections of the insulating layer and the first electrode; a projection of the third part of the second electrode at least partially overlaps with the projection of the second part of the insulating layer; the third part of the second electrode is insulated from the first electrode by the second part of the insulating layer; and the third part of the second electrode electrically connects the first part and the second part of the second electrode.

Optionally, the first electrode is a common electrode, and the second electrode is a pixel electrode.

Optionally, the insulating layer has a thickness in a range of approximately 0.5 µm to approximately 2.0 µm.

Optionally, the insulating layer has a thickness in a range of approximately 1.0 µm to approximately 1.5 µm.

In another aspect, the present invention provides a display apparatus comprising the array substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
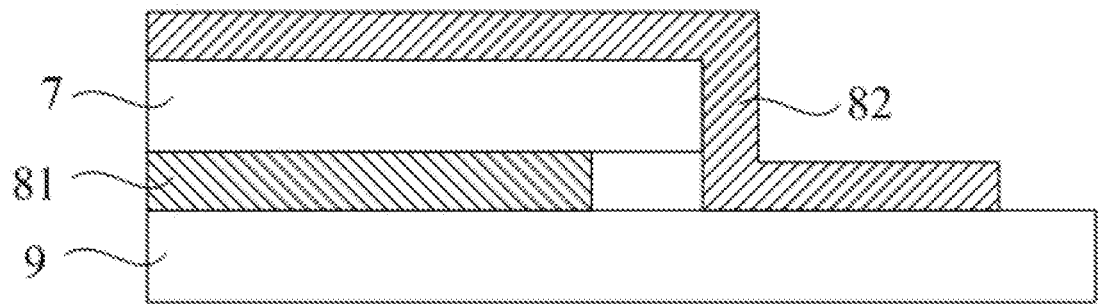
FIG. 1 is a schematic diagram illustrating the structure of a conventional array substrate.

FIG. 1 is a schematic diagram illustrating the structure of a conventional array substrate. Referring to FIG. 1, a conventional inorganic insulating material (e.g. silicon oxide, silicon nitride, etc.) is used to form an insulating layer (e.g., the passivation layer 7) on a first conductive structure (e.g., a common electrode 81). Due to over-etching, a recess is formed along the edge of the common electrode 81 (e.g., underneath the insulating layer 1) in the region where the pixel electrode 82 crosses over the edge of the common electrode 81. Therefore, at least in theory, the pixel electrode 82 will not be electrically connected to the common electrode 81.

Figure 2:
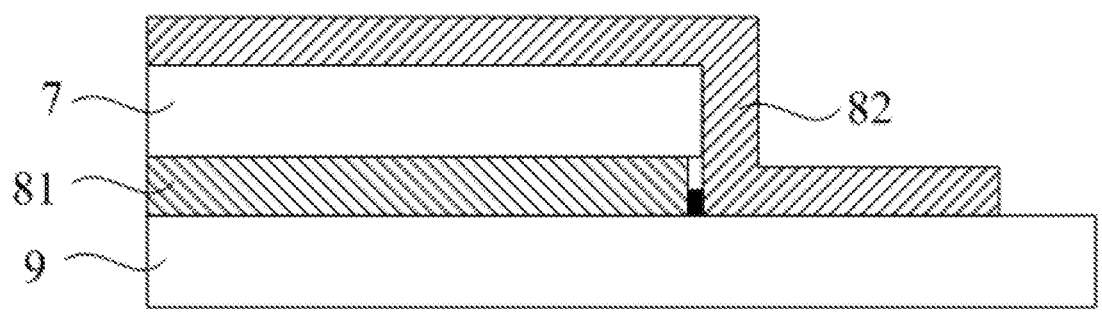
FIG. 2 is a schematic diagram illustrating the structure of a conventional array substrate with a short.

FIG. 2 is a schematic diagram illustrating the structure of a conventional array substrate with a short. Referring to FIG. 2, when the common electrode 81 was insufficiently over-etched, the recess under the edge of passivation layer 7 is too narrow. In this situation, the common electrode 81 can easily connect to pixel electrode 82, leading to short in circuit.

Figure 3:
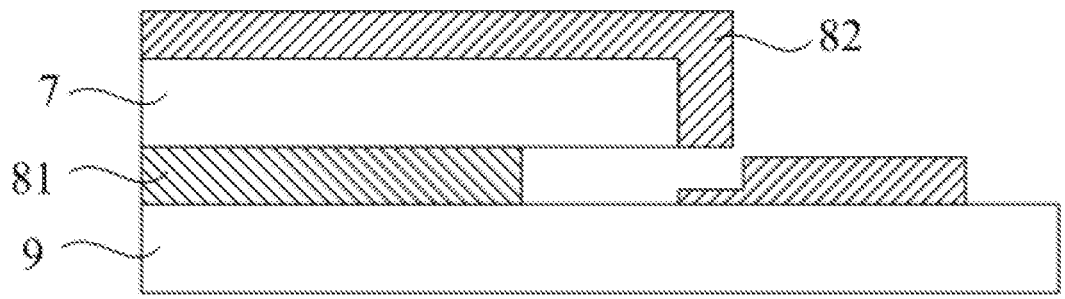
FIG. 3 is a schematic diagram illustrating the structure of a conventional array substrate with line opens.

FIG. 3 is a schematic diagram illustrating the structure of a conventional array substrate with line opens. Referring to FIG. 3, when the common electrode 81 is overly over-etched, the recess between the common electrode 81 and the pixel electrode 82 is too wide, leading to formation of bubbles in the recess. The bubbles in the recess may break the pixel electrode 82, resulting in line open. Moreover, a relatively high temperature is required in the process of forming the passivation layer using an inorganic insulating material. The high temperature will lead to the crystallization of indium tin oxide in the common electrode 81. Crystallized indium tin oxide has good corrosion resistance. In the subsequent wet etching of the crystallized indium tin oxide to form the common electrode 81, unetched residues of the crystallized indium tin oxide may remain in the array substrate, affecting resolution and electrical performance of the array substrate.

Accordingly, the present disclosure provides, inter alia, a method of fabricating an array substrate, an array substrate, and a display apparatus that substantially obviate one or more of the problems due to limitations and disadvantages of the related art. In one aspect, the present disclosure provides a method of fabricating an array substrate. In some embodiments, the method incudes forming a first conductive material layer on a base substrate; forming an insulating layer on a side of the first conductive material layer distal to the base substrate, the insulating layer formed to cover a first part of the first conductive material layer, exposing a second par of the first conductive material layer; over-etching the first conductive material layer to remove the second part of the first conductive material layer, and remove a portion of a periphery of the first part of the first conductive material layer to form a recess between the insulating layer and the base substrate, thereby forming a first electrode; and subsequent to forming the first electrode and the recess, annealing the insulating layer to mobilize a portion of the insulating layer above the recess and fill the recess with a mobilized insulating material. Optionally, the recess is formed in a recess region, an orthographic projection of insulating layer on the base substrate substantially covers an orthographic projection of the first electrode on the base substrate and an orthographic projection of the recess region on the base substrate. Optionally, the orthographic projection of insulating layer on the base substrate substantially overlaps with a combination of the orthographic projection of the first electrode on the base substrate and the orthographic projection of the recess region on the base substrate.

Figure 4A:
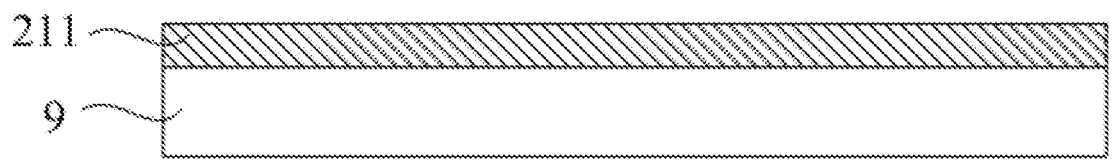
FIGS. 4A to 4E illustrate a process of fabricating an array substrate in some embodiments according to the present disclosure.
Figure 4B:
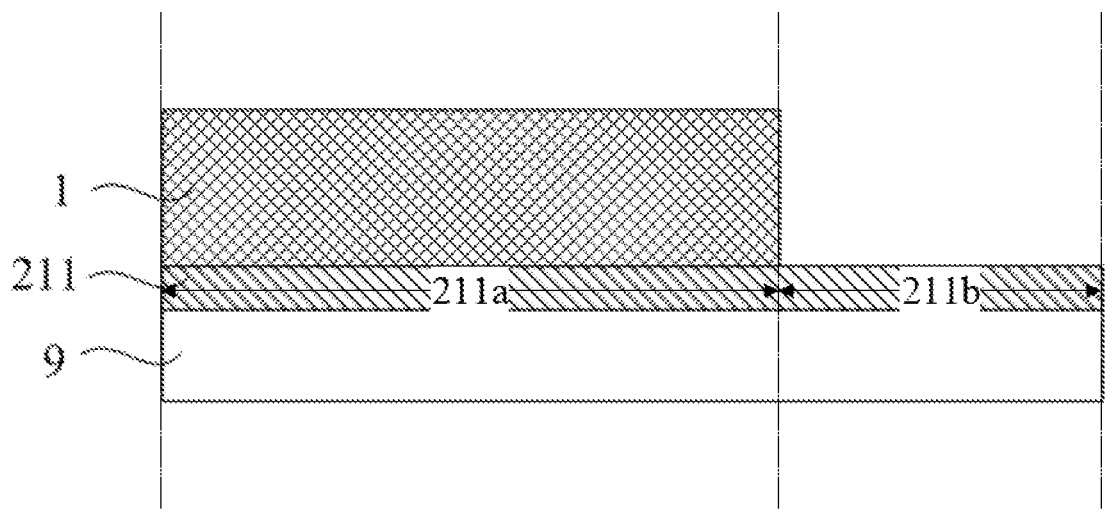
Figure 4C:
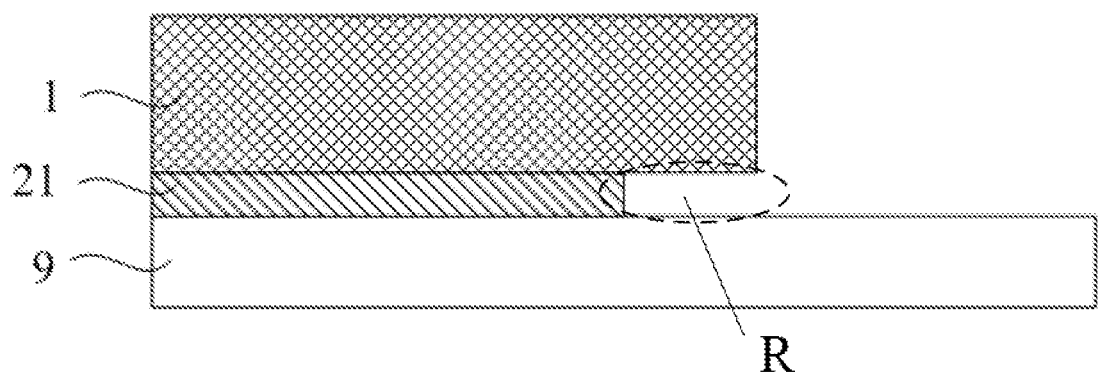
Figure 4D:
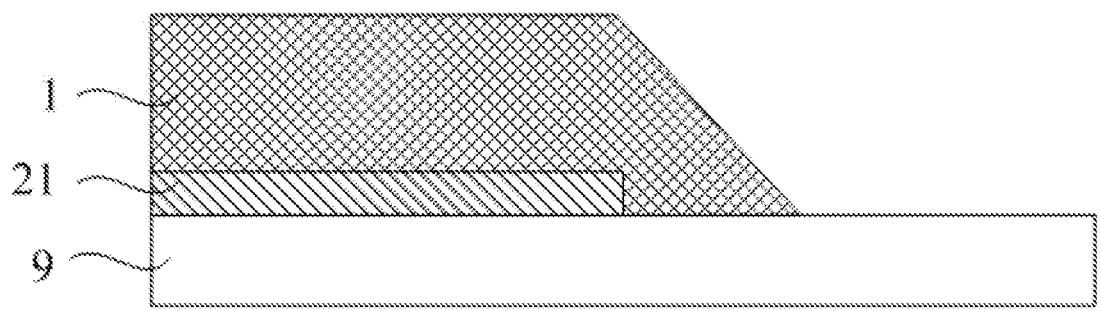
Figure 4E:
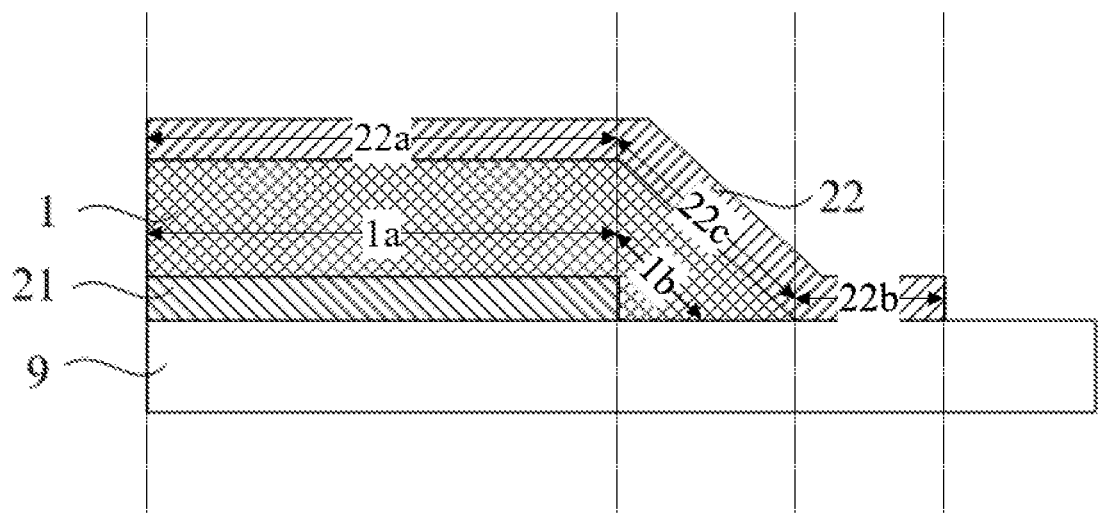

FIGS. 4A to 4E illustrate a process of fabricating an array substrate in some embodiments according to the present disclosure. Referring to FIG. 4A, a first conductive material layer 211 is formed on a base substrate 9. Referring to FIG. 4B, an insulating layer 1 is formed on a side of the first conductive material layer 211 distal to the base substrate 9. The insulating layer 1 is formed to have a pattern that partially covers the first conductive material layer 211. Specifically, the insulating layer 1 is formed to cover a first part 211a of the first conductive material layer 211, exposing a second part 211b of the first conductive material layer 211. Referring to FIG. 4C, the process further includes over-etching the first conductive material layer 211 to form a first electrode 21 and a recess R. Specifically, the second part 211b of the first conductive material layer 211 and a portion of a periphery of the first part 211a of the first conductive material layer 211 are removed during the over-etching step, thereby forming a first electrode 21 and a recess R. The recess R is formed in a region corresponding to the portion of the periphery of the first part 211a of the first conductive material layer 211 removed during over-etching. Portions of the material layer 211 uncovered by the insulating layer 1 and portions under the edge of the insulating layer 1 is etched. The recess R is generated under the edge of insulating layer 1. Referring to FIG. 4D, the process further includes annealing the insulating layer 1 to fill in the recess R. Specifically, subsequent to forming the first electrode 21 and the recess R, the insulating layer 1 is annealed to mobilize a portion of the insulating layer 1 above the recess R, and fill the recess R with a mobilized insulating material. Referring to FIG. 4E, subsequent to annealing the insulating layer 1, a second electrode 22 is formed on a side of the insulating layer 1 distal to the base substrate 9. The second electrode 22 is formed to be insulated from the first electrode 21 by the insulating layer 1 and the mobilized insulating material filled in the recess R.

Optionally, the step of forming the second electrode 22 includes forming a second conductive material layer on a side of the insulating layer 1 distal to the base substrate 9, and patterning the second conductive material layer to form the second electrode 22. Optionally, the second electrode 22 is formed to include at least three parts, the first part 22a and the third part 22c covering the insulating layer 1 and the second part 22b substantially outside the region corresponding to the insulating layer 1. The third part 22c electrically connects the first part 22a and the second part 22b.

In some embodiments, the insulating layer 1 is formed using a resin material. Optionally, the step of forming the insulating layer 1 includes forming a resin material layer on the first conductive material layer 211, exposing the resin material layer using a mask plate, developing the resin material layer, thereby forming the insulating layer 1.

In the present method, the first electrode 21 and the insulating layer 1 are formed using a single patterning process with a single mask plate, greatly simplifying the fabricating process. Optionally, the insulating layer 1 is formed with resin layer. Optionally, the insulating layer 1 is annealed. During annealing process, the insulating material in at least a portion of the insulating layer 1 is mobilized (e.g., softened and deformed). A mobilized insulating material from the mobilized portion of the insulating layer 1 is then distributed into the recess R. The mobilized insulating material at least partially (e.g., completely) fills in the recess R. In one example, a side surface of the first electrode 21 is covered by the mobilized insulating material, thereby preventing the first electrode 21 from being connected to the second electrode 22 (e.g., insulating a side surface of the first electrode 21 from the second electrode 22). The short between the first electrode 21 and the second electrode 22 occurred in the conventional array substrate can be avoided. Consequently, subsequent to the annealing process, the recess R underneath the insulating layer 1 is eliminated from the array substrate. Defects such as bubble and line open due to the recess R can be completely avoided. In another example, the insulating layer 1 is formed using a resin material, formation of which only requires a relatively low temperature. Accordingly, the process of forming the insulating layer 1 does not involve a high temperature at which the first conductive material layer 211 may be crystallized. The over-etching process to form the first electrode 21 is performed subsequent to forming the insulating layer 1 but prior to the annealing process. Therefore, the first conductive material layer 211 is not crystallized during over-etching step. The first conductive material layer 211 can be easily etched and the etching process will not generate any residue.

In some embodiments, the first electrode 21 is a common electrode. Optionally, the second electrode 22 is a pixel electrode. To cover the side surface of the first electrode 21, a certain thickness of the insulating layer 1 is required, resulting in a segment difference along the edge of the insulating layer 1. A large segment difference due to the thickness of the insulating layer 1 may result in line open in a layer subsequently formed on the first insulating layer 1, at a position around the edge of the insulating layer. Optionally, the first electrode 21 is an electrode having a simple shape and a minimal peripheral edge. Typically, the common electrode is a large integral electrode, making it a suitable candidate as the first electrode 21.

In some embodiments, the second electrode 22 is a pixel electrode. Optionally, the first electrode 21 is a common electrode. Typically, the pixel electrode needs to be connected to a drain electrode of a thin film transistor located outside the region corresponding to the insulating layer 1. Thus, the pixel electrode typically crosses over the edge of the first electrode 21 to extend into a region outside the region corresponding to the insulating layer 1.

In some embodiments, the first electrode 21 is a pixel electrode, and the second electrode 22 is a common electrode.

In some embodiments, the first electrode 21 is an anode, and the second electrode 22 is a cathode. In some embodiments, the first electrode 21 is a cathode, and the second electrode 22 is an anode.

In one example, a first conductive material layer 211 is formed on the base substrate 9. Referring to FIG. 4A, the first conductive material layer 211 is formed as an integral layer on a base substrate 9. Various appropriate conductive materials may be used for making the first conductive material layer 211. In one example, the first conductive structure 21 is common electrode, the material for making the first conductive material layer 211 may be a transparent conductive material, e.g., a metal oxide material such as indium tin oxide.

Referring to FIG. 4B, the process further includes forming an insulating layer 1. The insulating layer 1 is formed to have a pattern that partially covers the first conductive material layer 211. For example, the insulating layer 1 is formed to cover a first part 211a of the first conductive material layer 211, exposing a second part 211b of the first conductive material layer 211. Optionally, the insulating layer 1 is formed by first forming a resin material layer on the first conductive material layer 211, and patterning the resin material layer using a mask plate thereby forming the insulating layer 1.

In some embodiments, the insulating layer is formed to have a thickness in a range of approximately 0.5 μm to approximately 2.0 μm. Optionally, the insulating layer is formed to have a thickness in a range of approximately 1.0 μm to approximately 1.5 μm.

In some embodiments, the step of forming the insulating layer includes forming a resin material layer and patterning the resin material layer using a lithography process. Optionally, the step pf patterning the resin material layer includes exposing the resin material layer using a mask plate, developing the exposed resin material layer, and removing a portion of the resin material layer (e.g., an exposed portion when a positive photoresist is used, or an unexposed portion when a negative photoresist is used) thereby forming the insulating layer 1. Optionally, the resin material layer is a photoresist resin material layer (e.g., by adding a photosensitive material in the resin material). Optionally, the insulating layer 1 may be formed by other processes, such as inkjet printing or mold printing.

In some embodiments, subsequent to forming the insulating layer and prior to over-etching the first conductive material layer and annealing the insulating layer, the method further includes a pre-annealing process. A newly formed resin layer has a relatively high fluidity. Optionally, the resin layer is slightly pre-dried before etching, in order to pre-curing the resin layer and avoid resin layer deformation during subsequent etching process. Since the deformation of resin before etching affects the accuracy of the pattern of the first conductive structure 21. Optionally, pre-annealing the insulating layer is performed at a pre-annealing temperature in a range of approximately 120 degrees Celsius to approximately 150 degrees Celsius. Optionally, pre-annealing the insulating layer is performed for an annealing duration in a range of approximately 2 minutes to approximately 5 minutes.

In some embodiments, a first conductive material layer 211 is etched to form a first electrode 21 by getting rid of the portions of first conductive material layer 211 uncovered by insulating layer 1 and the portion of first conductive material layer 211 under the edge of insulating layer 1. Recess is generated under the edge of insulating layer 1. Referring to FIG. 4B and FIG. 4C, the first conductive material layer 211 is over-etched to remove the second part 211b of the first conductive material layer 211 and a portion of a periphery of the first part 211a of the first conductive material layer 211. Subsequent to the over-etching step, the first electrode 21 and the recess R are formed. The recess R is formed in a region corresponding to the portion of the periphery of the first part 211a of the first conductive material layer 211 removed during over-etching. In one example, to etch the first conductive material layer (e.g. wet etching), the insulating layer 1 is used as a photoresist or a mask plate, the insulating layer 1 prevents the underlying first conductive material layer 211 from being etched. Therefore, the underlying first conductive material layer 211 remains to form the first electrode 21. In another example, and referring to FIG. 4C, the etching process is an over-etching process. After etching the first conductive material layer 211 uncovered by the insulating layer 1, the portion of the first conductive material layer 211 under the edge of insulating layer 1 is over-etched inward from the end of the first conductive material layer 211. After this process, the first electrode 21 has an area smaller than an area of the insulating layer 1, e.g., the pattern of the first electrode 21 is a "shrunk" pattern of the insulating layer 1.

In some embodiments, a first electrode 21 is formed without the need of using lithography process twice. Therefore, the total number of patterning processes is reduced and the fabricating process simplified. Optionally, before the over-etching step, the first conductive material layer 211 is never subject to a relatively high temperature (since the step to form the resin insulating layer does not need a high temperature). Accordingly, the first conductive material layer 211 is not crystallized before it is etched. The first conductive material layer 211 can be easily etched without generating residue. An accurate pattern of the first electrode 21 can be obtained, enhancing the resolution and electrode performance.

In some embodiments, a mobilized insulating material from a mobilized portion of the insulating layer 1 during the annealing process fills the recess R. Referring to FIG. 4D, during the annealing process, the insulating layer 1 is subjected to flowing deformation before it is completely solidified, e.g., the insulating layer 1 flows toward the recess R under its edge and fills the recess R. Optional, the insulating layer 1 is resin layer. For example, although annealing may cause the crystallization of a first conductive structure 21, the first electrode 21 is formed prior to the annealing step and there is no need for additional etching. Any adverse effect of the crystallization of the first electrode 21 is irrelevant to the etching process, which is complete before the crystallization of the first electrode 21. Because the crystallization can improve the conductivity of the first electrode 21, it is beneficial to the performance of the first electrode 21. Optionally, the step of annealing the insulating layer is performed at an annealing temperature in a range of approximately 220 degrees Celsius to approximately 250 degrees Celsius. Optionally, the step of annealing the insulating layer is performed for an annealing duration in a range of approximately 20 minutes to approximately 30 minutes.

In some embodiments, the second electrode 22 is formed on a side of the insulating layer 1 distal to the base substrate 9. The second electrode 22 is formed to have at least three parts, the first part 22a and the third part 22c covering the insulating layer 1 and the second part 22b substantially outside the region corresponding to the insulating layer 1. The third part 22c electrically connects the first part 22a and the second part 22b. Optionally, the first part 22a and the third part 22c of the second electrode 22 (e.g. a pixel electrode) crosses over the edge of the insulating layer 1, e.g., to connect with a drain electrode of a thin film transistor. Referring to FIG. 4E, the side surface of the first electrode 21 is completely covered by the insulating layer 1. Thus, whether or not the first electrode 21 is sufficiently over-etched, the first electrode 21 will not be connected to the second electrode 22, e.g., a short between the first electrode 21 and the second electrode 22 is prevented. Because the recess R is filled by the insulating layer 1, no bubble will be generated to break the second electrode 22. The line open in the second electrode 22 can be avoided. Optionally, the second electrode 22 is formed by a photolithography process. During photolithography process, a second mask plate (2 Mask) is used.

In some embodiments, apart from steps of forming the first electrode 21, the insulating layer 1 and the second electrode 22, the method further includes forming additional layers of the array substrate, such as steps of forming a buffer layer, a gate electrode, a plurality of gate lines, a plurality of common electrode lines, a gate insulating layer, an active layer, a source electrode and a drain electrode, a plurality of data lines, and so on.

In another aspect, the present disclosure provides an array substrate. In some embodiments, and referring to FIG. 4E, the array substrate includes a base substrate 9, a first electrode 21 on the base substrate 9, an insulating layer 1 on a side of the first electrode 21 distal to the base substrate 9; and a second electrode 22 on a side of the insulating layer 1 distal to the first electrode 21. In some embodiments, the insulating layer 1 includes at least a first part 1a and a second part 1b. Optionally, a projection of the first part 1a of the insulating layer 1 on the base substrate 9 substantially overlaps with a projection of the first electrode 21 on the base substrate 9. Optionally, a projection of the second part 1b of the insulating layer 1 on the base substrate 9 is substantially non-overlapping with the projection of the first electrode 21 on the base substrate 9. The second part 1b of the insulating layer 1 and the first electrode layer 21 are in direct contact with a same layer (e.g., a layer immediately underneath the first electrode layer 21). The second part 1b of the insulating layer 1 and the first electrode layer 21 are both connected to the same layer without any intermediate connecting structure.

In some embodiments, and referring to FIG. 4E, the second part 1b of the insulating layer 1 directly abuts a periphery of the first electrode 21, and the second part 1b of the insulating layer 1 insulates at least a portion of the periphery of the first electrode 21 from the second electrode 22.

In some embodiments, and referring to FIG. 4E, the array substrate further includes a second electrode 22 on a side of the insulating layer 1 distal to the first electrode 21. Optionally, the second electrode 22 includes at least a first part 22a, a second part 22b, and a third part 22c. Optionally, a projection of the first part 22a of the second electrode 22 at least partially overlaps with the projection of the first part 1a of the insulating layer 1 on the base substrate 9. Optionally, a projection of the second part 22b of the second electrode 22 is substantially non-overlapping with projections of the insulating layer 1 and the first electrode 21. Optionally, a projection of the third part 22c of the second electrode 22 at least partially overlaps with the projection of the second part 1b of the insulating layer 1. As shown in FIG. 4E, the third part 22c of the second electrode 22 is insulated from the first electrode 21 by the second part 1b of the insulating layer 1, and the third part 22c of the second electrode 22 electrically connects the first part 22a and the second part 22b of the second electrode 22.

Optionally, the first electrode 21 is a common electrode, and the second electrode 22 is a pixel electrode. Optionally, the first electrode 21 is a pixel electrode, and the second electrode 22 is a common electrode. Optionally, the insulating layer has a thickness in a range of approximately 0.5 µm to approximately 2.0 µm. Optionally, the insulating layer has a thickness in a range of approximately 1.0 µm to approximately 1.5 µm.

In another aspect, the present disclosure provides a display apparatus having the array substrate described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such tens should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating an array substrate, comprising:
    forming a first conductive material layer on a base substrate;
    forming an insulating layer on a side of the first conductive material layer distal to the base substrate, the insulating layer formed to cover a first part of the first conductive material layer, exposing a second part of the first conductive material layer;
    over-etching the first conductive material layer to remove the second part of the first conductive material layer, and remove a portion of a periphery of the first part of the first conductive material layer to form a recess between the insulating layer and the base substrate, thereby forming a first electrode;
    subsequent to forming the first electrode and the recess, annealing the insulating layer to mobilize a portion of the insulating layer above the recess and fill the recess with a mobilized insulating material of the portion of the insulating layer; and
    subsequent to forming the insulating layer and prior to over-etching the first conductive material layer and annealing the insulating layer, pre-annealing the insulating layer.

2. The method of claim 1, wherein forming an insulating layer comprises:
    forming a resin layer on the side of the first conductive material layer distal to the base substrate;
    exposing the resin layer using a mask plate;
    developing the resin layer subsequent to exposing; and
    removing a portion of the resin layer thereby forming the insulating layer.

3. The method of claim 1, subsequent to annealing the insulating layer, further comprising forming a second electrode on a side of the insulating layer distal to the base substrate;
    wherein the second electrode is insulated from the first electrode by the insulating layer and the mobilized insulating material filled in the recess.

4. The method of claim 3, wherein the second electrode is a pixel electrode.

5. The method of claim 1, wherein the first electrode is a common electrode.

6. The method of claim 1, wherein the insulating layer is formed to have a thickness in a range of approximately 0.5 µm to approximately 2.0 µm.

7. The method of claim 6, wherein the insulating layer is formed to have a thickness in a range of approximately 1.0 µm to approximately 1.5 µm.

8. The method of claim 1, wherein annealing the insulating layer is performed at an annealing temperature in a range of approximately 220 degrees Celsius to approximately 250 degrees Celsius.

9. The method of claim 1, wherein annealing the insulating layer is performed for an annealing duration in a range of approximately 20 minutes to approximately 30 minutes.

10. The method of claim 1, wherein pre-annealing the insulating layer is performed at a pre-annealing temperature in a range of approximately 120 degrees Celsius to approximately 150 degrees Celsius.

11. The method of claim 1, wherein pre-annealing the insulating layer is performed for an annealing duration in a range of approximately 2 minutes to approximately 5 minutes.

12. A display apparatus, comprising the array substrate fabricated according to the method of claim 1.

* * * * *